US009695040B2

(12) United States Patent
Bolognia et al.

(10) Patent No.: US 9,695,040 B2
(45) Date of Patent: Jul. 4, 2017

(54) MICROPHONE SYSTEM WITH INTEGRATED PASSIVE DEVICE DIE

(71) Applicant: Analog Devices, Inc., Norwood, MA (US)

(72) Inventors: David Bolognia, North Andover, MA (US); Alain Valentin Guery, Andover, MA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 13/652,950

(22) Filed: Oct. 16, 2012

(65) Prior Publication Data

US 2014/0103464 A1    Apr. 17, 2014

(51) Int. Cl.
| H01L 29/82 | (2006.01) |
|---|---|
| H01L 23/02 | (2006.01) |
| H01L 23/34 | (2006.01) |
| B81C 1/00 | (2006.01) |
| H04R 1/04 | (2006.01) |

(52) U.S. Cl.
CPC .......... *B81C 1/00253* (2013.01); *H04R 1/04* (2013.01); *B81B 2207/012* (2013.01); *B81C 2203/0792* (2013.01); *H01L 2224/48091* (2013.01); *H01L 2924/1461* (2013.01); *H01L 2924/3011* (2013.01); *H04R 2201/003* (2013.01)

(58) Field of Classification Search
CPC .......... H01L 29/42396; H01L 29/1062; H01L 29/84; H01L 2924/15311; H01L 2224/16; H01L 2924/01078; H01L 2924/14; H01L 25/10; H01L 25/117; H01L 25/043; H01L 25/0657; H01L 25/074; H01L 25/0756; H01L 27/3209; H01L 25/041; H01L 25/065; H01L 25/07; H01L 25/165; H01L 2225/06513; H01L 2225/06517; H01L 23/48
USPC ....... 257/416, 245, 254, 685, 686, 777, 732, 257/778, 723
See application file for complete search history.

(56) References Cited

U.S. PATENT DOCUMENTS

| 4,558,184 | A | 12/1985 | Busch-Vishniac et al. .. 179/111 R |
|---|---|---|---|
| 7,674,646 | B2 | 3/2010 | Liu ............................... 438/51 |
| 7,742,275 | B2 | 6/2010 | Liu ............................... 361/277 |
| 7,795,709 | B2 | 9/2010 | Degani et al. ................. 257/659 |
| 8,138,014 | B2 * | 3/2012 | Chi et al. ...................... 438/106 |
| 8,369,553 | B2 * | 2/2013 | Dumas et al. ................ 381/324 |
| 8,409,970 | B2 * | 4/2013 | Lin et al. ...................... 438/464 |

(Continued)

FOREIGN PATENT DOCUMENTS

WO    WO 01/41497 A1    6/2001 ............... H04R 1/00

*Primary Examiner* — Kimberly Rizkallah
*Assistant Examiner* — Dilinh Nguyen
(74) *Attorney, Agent, or Firm* — Maryam Imam; Klintworth & Rozenblat IP LLC (57) ABSTRACT

A microphone system has a package forming an interior chamber, and a MEMS microphone secured within the interior chamber. The package forms an aperture for permitting acoustic access to the interior of the chamber and thus, the MEMS microphone. The system also has two dies; namely, the system has a primary circuit die within the interior chamber, and an integrated passive device die electrically connected with the primary circuit die. The primary circuit die is electrically connected with the MEMS microphone and has at least one active circuit element.

31 Claims, 8 Drawing Sheets

(56) References Cited

U.S. PATENT DOCUMENTS

| | | | |
|---|---|---|---|
| 8,472,648 B2 * | 6/2013 | Wang et al. | 381/175 |
| 8,598,797 B2 * | 12/2013 | Choutov et al. | 315/207 |
| 2004/0084766 A1 | 5/2004 | Shieh | |
| 2007/0057602 A1 | 3/2007 | Song | 310/328 |
| 2007/0058826 A1 * | 3/2007 | Sawamoto et al. | 381/174 |
| 2010/0066390 A1 * | 3/2010 | Suzuki | G01D 5/24 324/686 |
| 2010/0183181 A1 * | 7/2010 | Wang | H04R 19/005 381/361 |
| 2010/0283085 A1 * | 11/2010 | Bemanian et al. | 257/209 |
| 2011/0050357 A1 * | 3/2011 | Kim et al. | 333/32 |
| 2011/0127623 A1 | 6/2011 | Fueldner | |
| 2011/0254111 A1 | 10/2011 | Leclair | |
| 2014/0091406 A1 * | 4/2014 | Harney | H04R 1/086 257/416 |

* cited by examiner

MICROPHONE SYSTEM WITH INTEGRATED PASSIVE DEVICE DIE

FIELD OF THE INVENTION

The invention generally relates to acoustic devices and, more particularly, the invention relates to MEMS acoustic devices and circuitry associated with MEMS acoustic devices.

BACKGROUND OF THE INVENTION

MEMS microphones typically are secured within an interior chamber of a package to protect them from the environment. An integrated circuit chip, also mounted within the interior chamber and having active circuit elements, processes electrical signals to and from the microphone. One or more apertures through some portion of the package permit acoustic signals to reach the microphone. Receipt of the audio signal causes the microphone, with its corresponding integrated circuit chip, to produce an electronic signal representing the audio qualities of the received signal.

Due to the small profile desired in many MEMS microphone applications, it is undesirable to mount too many components within the interior package chamber.

SUMMARY OF VARIOUS EMBODIMENTS

In accordance with one embodiment of the invention, a microphone system has a package forming an interior chamber, and a MEMS microphone secured within the interior chamber. The package forms an aperture for permitting acoustic access to the interior of the chamber and thus, the MEMS microphone. The system also has two dies; namely, the system has a primary circuit die within the interior chamber, and an integrated passive device die electrically connected with the primary circuit die. The primary circuit die is electrically connected with the MEMS microphone and has at least one active circuit element.

The integrated passive device may be configured to perform at least one of the following functions: RF filtering, programming of the system, and power supply decoupling. Some embodiments physically mount the integrated passive device die to the primary circuit die. For example, a face of the integrated passive device die may be mounted to a face of the primary circuit die. As a related example, the integrated passive device and primary circuit die may be arranged in a stacked configuration. To electrically communicate, one or both the primary circuit die and integrated passive device die have a plurality of electrical interconnection bumps. In that case, one or both the primary circuit die and integrated passive device die may have a high number of bumps (e.g., between 20 and 60 bumps).

The package may include 1) a substrate supporting the MEMS microphone and 2) a conductive lid (e.g., a solid metal lid or a conductive coated polymeric lid) to provide mitigate electromagnetic interference for the MEMS microphone. The package also may have a secondary lid coupled with the substrate, where the substrate is positioned between the conductive lid and secondary lid. Among other things, the substrate may be formed from a circuit board material (e.g., FR-4 or bismaleimide-triazine resin laminate, also known as "BT" laminate). The microphone may be mounted in any of a number of positions within the package. For example, the microphone may be mounted over the aperture.

In accordance with another embodiment of the invention, a transducer system includes a package forming an interior chamber having at least one wall, and a MEMS acoustic transducer secured to the at least one wall within the interior chamber. The package forms an aperture for permitting acoustic access to the interior of the chamber and the MEMS acoustic transducer. The system further includes a primary circuit die within the interior chamber, and an integrated passive device die electrically connected with the primary circuit die. The primary circuit die is electrically connected with the MEMS acoustic transducer and has at least one active circuit element. To communicate with components outside of the package, the system further includes a plurality of pads formed on the package. The MEMS acoustic transducer is electrically connected with at least one of the plurality of pads.

In accordance with other embodiments of the invention, a method of fabricating a MEMS microphone system provides a substrate, secures a MEMS microphone to the substrate, and then positions two dies—a primary circuit die proximate to the MEMS microphone, and an integrated passive device die proximate to the primary circuit die. The method also electrically connects the primary circuit die with the integrated passive device die (either before, while, or after positioning the dies). One or both the integrated passive device die and the primary circuit die are secured to the substrate. The method also secures a lid to the substrate to form a package having a chamber. The lid is electrically connected with the substrate to mitigate electromagnetic interference. The package chamber contains the MEMS microphone die, integrated passive device die, and primary circuit die. Moreover, the package has an aperture for permitting acoustic signals access into the chamber and to the MEMS microphone die.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a MEMS microphone system has enhanced functionality typically provided by passive circuit elements without requiring a high package volume. The MEMS microphone system implements such functionality using an integrated passive device die. Among other ways, the integrated passive device die may be stacked with another die inside its package, consequently minimizing the need for scarce internal package real estate. Details of these and other illustrative embodiments are discussed below.

Figure 1A:
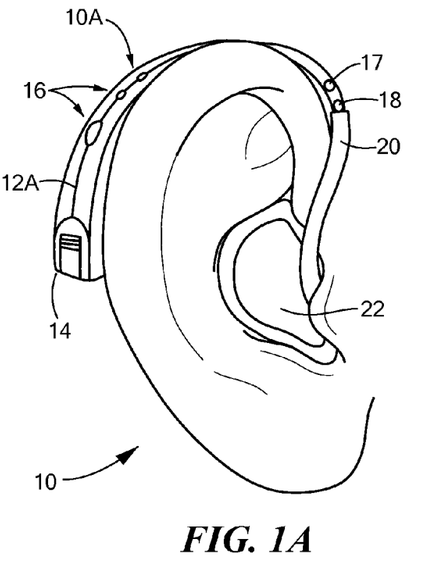
FIGS. 1A-1D schematically show a plurality of different types of hearing aids that may incorporate illustrative embodiments of the invention.
Figure 1B:
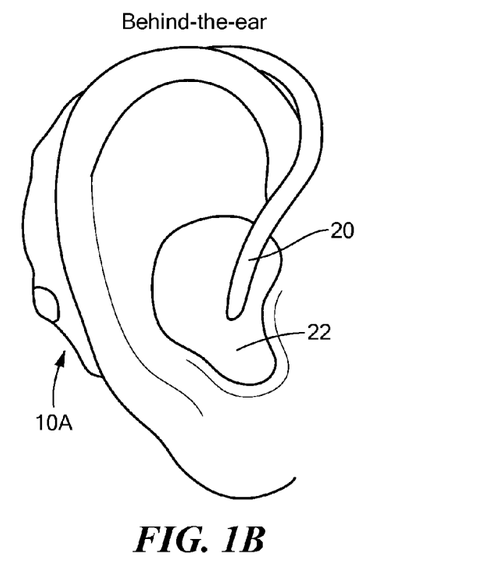
Figure 1C:
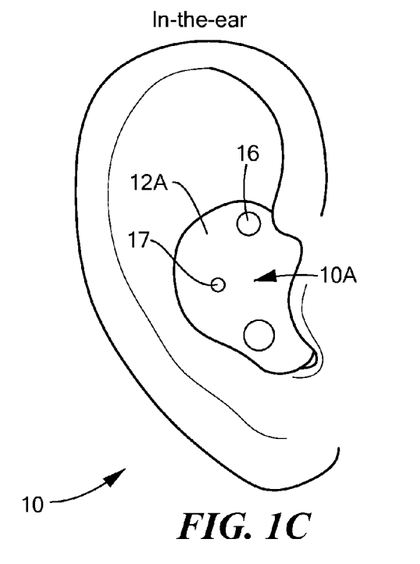
Figure 1D:
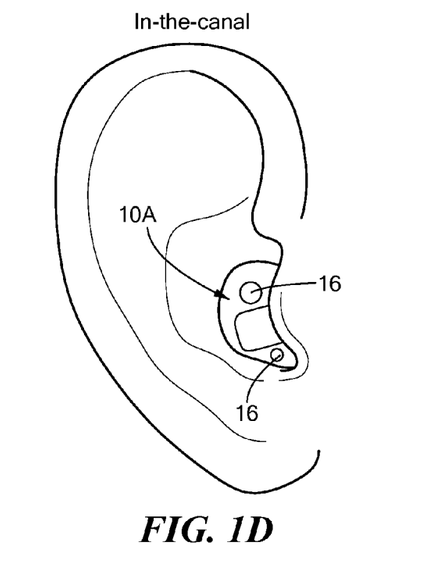

FIGS. 1A-1D illustratively show various different types of hearing aids 10A that may incorporate microphone systems implementing illustrative embodiments of the invention. FIGS. 1A and 1B show different "behind the ear" types of hearing aids 10A that, as their name suggests, have a significant portion secured behind the ear during use. In contrast, FIGS. 1C and 1D show hearing aids 10A that do not have a component behind the ear. Instead, these types of hearing aids 10A mount within the ear. Specifically, FIG. 1C shows an "in-the-ear" hearing aid 10A which, as its name suggests, mounts in-the-ear, while FIG. 1D shows an "in-the-canal" hearing aid 10A which, as its name suggests, mounts more deeply in the ear—namely, in the ear canal.

With reference to FIG. 1A, the intelligence, sensors (e.g., microphone systems), and logic of the behind the ear type of hearing aid 10A lies primarily within a housing 12A that mounts behind the ear. To that end, the housing 12A forms an interior that contains internal electronics for processing audio signals, a battery compartment 14 (a powering module) for containing a battery that powers the hearing aid 10A, and mechanical controlling features 16, such as knobs, for controlling the internal electronics. In addition, the hearing aid 10A also includes a microphone system 17 (e.g., a packaged microphone die) for receiving audio signals, and a speaker 18 for transmitting amplified audio signals received by the microphone 17 and processed by the internal electronics. A hollow tube 20 directly connected to the end of the hearing aid 10A, right near the speaker 18, channels these amplified signals into the ear. To maintain the position of this tube 20 and mitigate undesired feedback, the hearing aid 10A also may include an ear mold 22 (also part of the body of the hearing aid 10A) formed from soft, flexible silicone molded to the shape of the ear opening.

Among other things, the hearing aid 10A may have circuitry and logic for optimizing the signal generated through the speaker 18. More specifically, the hearing aid 10A may have certain program modes that optimize signal processing in different environments. For example, this logic may include filtering systems that produce the following programs:

normal conversation in a quiet environment,
normal conversation in a noisy environment,
listening to a movie in a theater, and
listening to music in a small area.

The hearing aid 10A also may be programmed for the hearing loss of a specific user/patient. It thus may be programmed to provide customized amplification at specific frequencies. Some of this functionality can be implemented within its internal microphone system 17.

The other two types of hearing aids 10A typically have the same internal components, but in a smaller package. Specifically, the in-the-ear hearing aid 10A of FIG. 1C has a flexible housing 12A, with the noted internal components, molded to the shape of the ear opening. In particular, among other things, those components include a microphone 17 facing outwardly for receiving audio signals, a speaker (not shown) facing inwardly for transmitting those signals into the ear, and internal logic for amplifying and controlling performance.

The in-the-canal hearing aid 10A of FIG. 1D typically has all the same components, but in a smaller package to fit in the ear canal. Some in-the-canal hearing aids 10A also have an extension (e.g., a wire) extending out of the ear to facilitate hearing aid removal. Because they fit in tight spots (e.g., behind the ear or in the ear canal), space for internal system components (e.g., microphones) is at a premium.

Figure 2:
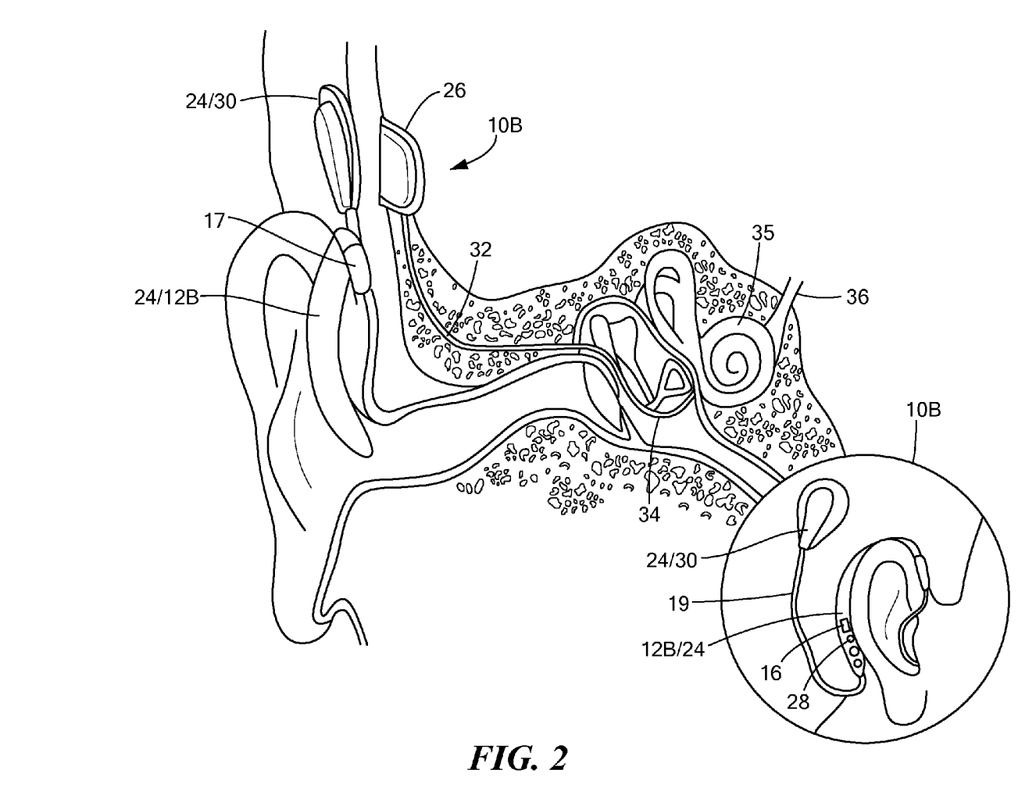
FIG. 2 schematically shows one example of a cochlear implant that may incorporate illustrative embodiments of the invention.

FIG. 2 schematically shows another type of hearing instrument, a cochlear implant 10B, which, in a similar manner, also has significant space constraints for its internal components. At a high level, a cochlear implant 10B has the same function as that of a hearing aid 10A; namely, to help a person hear normally audible sounds. A cochlear implant 10B, however, performs its function in a different manner by having an external portion 24 that receives and processes signals, and an implanted portion 26 physically located within a person's head.

To those ends, the external portion 24 of the cochlear implant 10B has a behind the ear portion with many of the same components as those in a hearing aid 10A behind the ear portion. The larger drawing in FIG. 2 shows this behind the ear portion as a transparent member since the ear covers it, while the smaller drawing of that same figure shows it behind the ear.

Specifically, the behind the ear portion includes a housing/body 12B that contains a microphone 17 for receiving audio signals, internal electronics for processing the received audio signals, a battery, and mechanical controlling features 16 (e.g., knobs) for controlling the internal electronics. Those skilled in the art often refer to this portion as the "sound processor" or "speech processor." A wire 19 extending from the sound processor connects with a transmitter 30 magnetically held to the exterior of a person's head. The speech processor communicates with the transmitter 30 via the wire 19.

The transmitter 30 includes a body having a magnet that interacts with the noted implanted metal portion 26 to secure it to the head, wireless transmission electronics to communicate with the implanted portion 26, and a coil to power the implanted portion 26 (discussed below). Accordingly, the microphone 17 in the sound processor receives audio signals, and transmits them in electronic form to the transmitter 30 through the wire 19, which subsequently wirelessly transmits those signals to the implanted portion 26.

The implanted portion 26 thus has a receiver with a microprocessor to receive compressed data from the external transmitter 30, a magnet having an opposite polarity to that in the transmitter 30 both to hold the transmitter 30 to the person's head and align the coils within the external portion 24/transmitter 30, and a coil that cooperates with the coil in the exterior transmitter 30. The coil in the implanted portion 26 forms a transformer with the coil of the external transmitter 30 to power its own electronics. A bundle of wires 32 extending from the implanted portion 26 passes into the ear canal and terminates at an electrode array 34 mounted within the cochlea 35. As known by those skilled in the art, the receiver transmits signals to the electrode array 34 to directly stimulate the auditory nerve 36, thus enabling the person to hear sounds in the audible range of human hearing.

Indeed, illustrative embodiments of the invention may implement microphone systems 17 in a variety of other underlying devices. For example, among other things, the microphone systems 17 discussed herein may be implemented in mobile telephones, smartphones, cameras, computers, gaming systems, and hand-held public announcement ("PA") devices. Accordingly, discussion of hearing instruments or some other higher level system is for exemplary purposes only and not intended to limit all embodiments of the invention.

Figure 3:
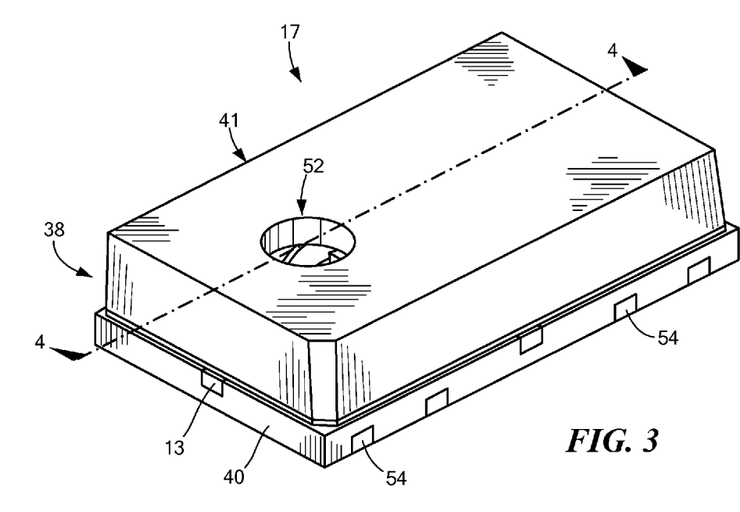
FIG. 3 schematically shows a perspective view of a packaged microphone that may implement illustrative embodiments of the invention.

FIG. 3 schematically shows a packaged microphone system 17 (also referred to as a "microphone system 17" or "packaged microphone 17") implemented in accordance with illustrative embodiments of the invention. The packaged microphone 17 has a package 38 that may be coupled with an underlying apparatus, such as a printed circuit board within a hearing instrument 10A or 10B or mobile telephone. The underlying apparatus, however, can comprise any of a variety of other devices (e.g., other integrated circuits). Accordingly, discussion of a printed circuit board is illustrative and not intended to limit a variety of other embodiments.

The package 38 has a base 40 (sometimes referred to by those in the art as a "substrate") that, together with a corresponding lid 41, forms an interior chamber 50 containing a microelectromechanical system microphone die 42 (discussed in detail below with regard to FIG. 4, also known as a "MEMS microphone" or "silicon microphone") for receiving and converting acoustic signals, and two chips (also in FIG. 4) for controlling signals within the system 17. Specifically, the two chips includes a primary circuit die 44 and an integrated passive device chip/die 46 (hereinafter "IPD 46"). The general function of the primary circuit die 44 is to control and manage input to and output from the microphone die 42 (also referred to as a "microphone chip 42"). For example, among other things, the primary circuit chip 44 may amplify varying capacitance signals produced by the microphone die 42, and control the voltage applied to the microphone die 42. In illustrative embodiments, the primary circuit chip 44 is implemented as an application specific integrated circuit, which is also known as an "ASIC."

In a similar manner, the primary function of the IPD 46 is to provide additional functionality to the microphone system 17. Among other things, those functions may include:

1. the ability to program the system,
2. to implement at least part of the programs described above for the hearing instruments,
3. enable more effective circuit trimming, facilitate lot tests,
4. enable better lot tracing,
5. radio frequency filtering (RF filtering) to reduce electromagnetic interference ("EMI"),
6. circuit coupling and decoupling,
7. impedance matching, and
8. power division.

As known by those skilled in the art, an IPD 46 typically is an integrated circuit having passive circuit elements only—namely, resistors, capacitors, and inductors. Illustrative embodiments thus position active elements (e.g., operational amplifiers having transistors) outside of the IPD 46. For example, the primary circuit die 44 may have a plurality of active elements, as well as some passive elements, implementing an operational amplifier (i.e., an "op-amp").

Because microphones dies/chips 42 can be susceptible to EMI, the package 38 preferably incorporates noise reducing technology. This noise reducing technology is in addition to, or instead of, RF filtering that may be implemented by the IPD 46. Accordingly, illustrative embodiments effectively form a Faraday cage around the microphone die 42 in any of a number of different manners. To that end, the lid 41 in the embodiments shown is a cavity-type, solid metal lid having four walls extending generally orthogonally from a top, interior face. As solid metal, the lid 41 does not require a metal coating on a plastic or other base material. Instead, illustrative embodiments form the lid 41 from a piece of metal, such as a piece of sheet metal. For example, in illustrative embodiments, the lid 41 is a formed metal lid having a generally cup-shaped concavity defining a part of the package chamber 50. The lid 41 secures to the top face of the substantially flat package base 40 to form the interior chamber 50. Walls formed from both the lid 41 and base 40, in any dimension, may be considered to define the chamber 50.

Other types of metal lids may be used. For example, the lid 41 may be flat and coupled to upwardly projecting walls extending from the base 40. Alternatively, the lid 41 may be formed from a non-conductive material, with or without a conductive layer, such as metal. Some embodiments form the lid 41 from a nonconductive base material impregnated with metal (e.g., silver particles) to effectively form a conductive barrier.

The lid 41 also has an audio input port 52 (also referred to as an aperture 52) that enables ingress of audio signals into the chamber 50. In alternative embodiments, however, the audio input port 52 is at another location, such as through another portion of the top face of the lid 41, the side of the lid 41 (discussed below), or through the base 40. Some embodiments may have multiple input ports 52 (e.g., a directional microphone).

Conventional techniques connect the lid 41 to the base 40. For example, after mounting the internal dies 42, 44, and 46 within the package chamber 50, conventional fabrication processes can connect the lid 41 to the base 40 with an adhesive. As known by those skilled in the art, a difference in the potential between the lid 41 and base 40 undesirably can interfere with movement of the internal components in the microphone die 42. For example, if the microphone system 17 includes a condenser microphone die 42, then a potential difference between the lid 41 and the base 40 could adversely impact its internal variable capacitor. Accordingly, conductive adhesive preferably is used to ensure that the lid 41 has the same potential as prescribed portions of the base 40. To that end, the base 40 may have a bond pad 13 that directly contacts the lid 41 to provide such a same potential. Alternative embodiments may use a non-conductive adhesive, a solder, or other adhering medium used in the art.

Audio signals entering the interior chamber 50 interact with the microphone die 42 and, consequently, the primary circuit die 44, to produce an electrical output signal. Moreover, depending on its function, the IPD 46 also may cooperate with the primary circuit die 44 and microphone die 42 to produce an electrical output signal. Specifically, acoustic signals contact the microphone die 42, which converts this acoustic signal into an electric signal. This electric signal is directed toward the primary circuit die 44 for processing.

The bottom face of the package base 40 has a number of external contacts/bond pads 54 for electrically (and physically, in many anticipated uses) connecting the microphone system 17 with an external apparatus (not shown but noted above), such as a printed circuit board or other electrical interconnect apparatus of the next level device (e.g., of a hearing instrument or mobile device). In illustrative embodiments, the package 38 is surface mounted to the circuit board. Accordingly, during use, the microphone die 42, IPD 46 (if used in that capacity), and primary circuit die 44 cooperate to convert audio signals received through the aperture 52 into electrical signals, and route those signals through external contacts/bond pads 54 in the base 40 to the circuit board.

In illustrative embodiments, the package base 40 is formed from an electrical interconnect apparatus, such as a ceramic package material, carrier, printed circuit board material (e.g., using alternating layers of FR-4 or a bismaleimide-triazine resin laminate-type material). Other types of packages may be used, however, such as premolded, leadframe-type packages (also referred to as a "premolded package"). As suggested above, the base 40 may be a cavity package, or a flat-type package.

Figure 4:
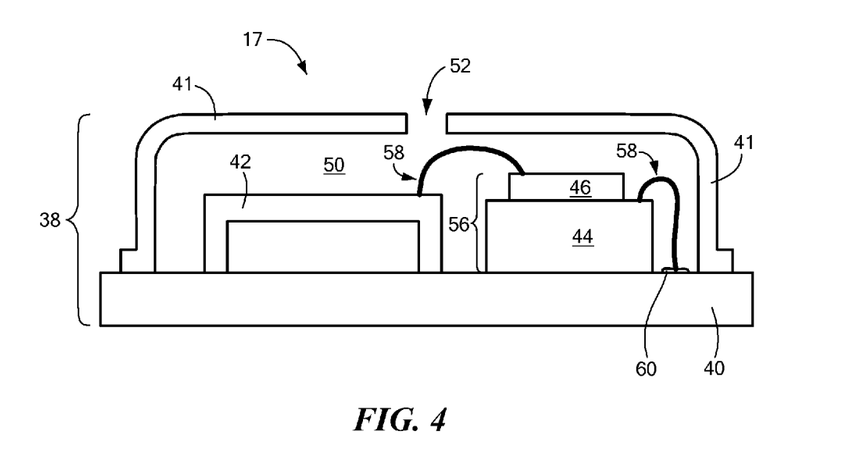
FIG. 4 schematically shows a cross-sectional view of the packaged microphone in FIG. 3 across line 4-4.

FIG. 4 schematically shows a cross-sectional view of the packaged microphone 17 of FIG. 3. To reduce space requirements within the interior chamber 50, the primary circuit die 44 and the IPD 46 are positioned on the base 40 (considered a wall of the chamber 50) in a stacked configuration adjacent to the microphone die 42. In other words, as shown, the primary circuit die 44 and IPD 46 share at least one vertical plane from the perspective of the drawings. For example, the general centers of the two chips 20 and 22 may be substantially aligned in the vertical direction. In this case, they also are physically and electrically connected. This connection is discussed in greater detail below with regard to FIGS. 6A and 6B. Accordingly, in this embodiment, the IPD 46 and primary circuit die 44 thus may be considered to be a single unit (sometimes referred to herein as a "stack 56"), both logically and physically. Specifically, both electrically cooperate to manage signals and power, among other things, within the package 38, thus logically functioning as a single unit. In a similar manner, since they are secured to each other in a stacked configuration (e.g., using a flip chip connection), they may be considered to be a single physical unit.

The stack 56 and the microphone die 42 preferably are closely positioned within the package interior and electrically connected with one or a plurality of wire bonds 58. The wire bond 58 illustratively extends between bond pads (not shown) on the primary circuit die 44 and the microphone die 42. In other embodiments, the microphone die wire bond 58 directly connects with internal pads 60 on the base 40. In both cases and in other cases, one or more wire bonds 58 may extend from pads on the stack 56 (e.g., from pads on the primary circuit die 44) to the interior pads 60 exposed on the base 40. These interior pads 60 connect with the exterior pads 54 to provide the requisite electrical communication with external devices.

Although FIG. 4 shows the IPD 46 on top of the primary circuit die 44 (from the perspective of the drawing), alternative embodiments may position the primary circuit die 44 on top of the IPD 46. In such alternative embodiments, the IPD 46 may be secured directly to the base 40, and support the primary circuit die 44. Again, both dies are electrically and physically connected. Moreover, the IPD 46 may be larger or smaller than the primary circuit die 44 in one or more dimensions. In yet other embodiments, the microphone system 17 has a plurality of IPDs 46, and/or a plurality of primary circuit dies either in a stacked configuration, not in a stacked configuration, or both (of course, using multiple dies of the two different types).

Although not shown in the drawings, some embodiments may position both the IPD 46 and primary circuit die 44 on the base 40. In that case, the microphone system 17 has other electrical interconnection means, such as wire bonds 58 between the IPD 46 and the primary circuit die 44. In a similar manner, the microphone die 42 may communicate with the IPD 46 and primary circuit die 44 using one or more wire bonds 58.

Some embodiments form the aperture 52 through the base 40. In that case, the microphone die 42 may be positioned directly over the aperture 52 (to maximize back volume), or next to the aperture 52.

Figure 5A:
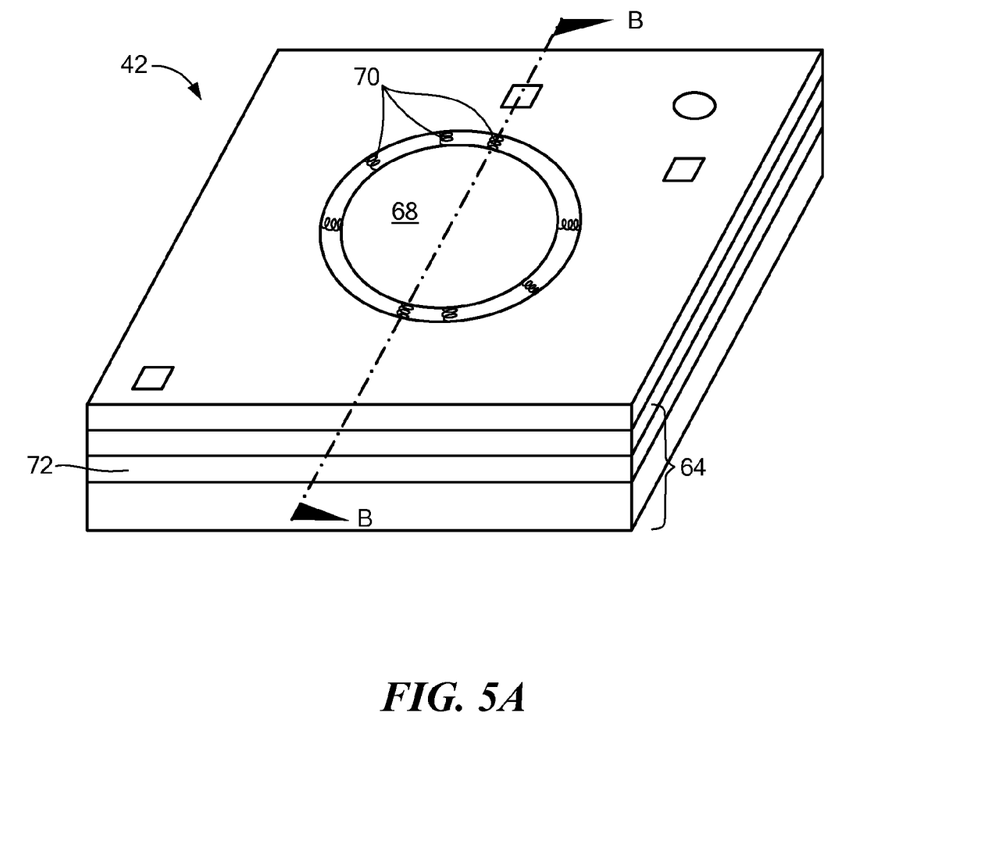
FIG. 5A schematically shows a perspective view of a MEMS microphone that may be used with illustrative embodiments of the invention.
Figure 5B:
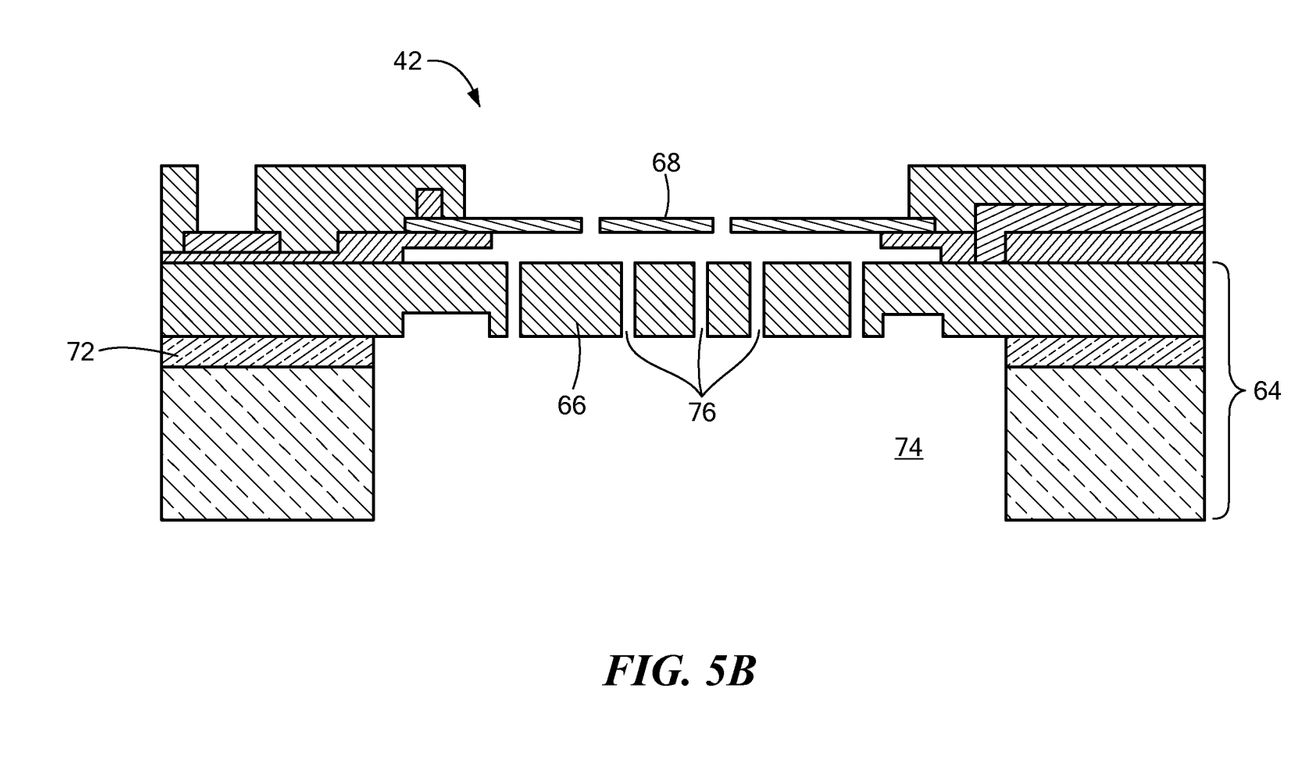
FIG. 5B schematically shows a cross-sectional view of the MEMS microphone of FIG. 5A across line B-B.

The microphone die 42 may implement any of a number of different types of microphone dies. For example, as suggested above, the microphone die 42 may be implemented as a MEMS microphone die. To that end, FIG. 5A schematically shows a top, perspective view of a MEMS microphone die 42 that may be used with illustrative embodiments of the invention. FIG. 5B schematically shows a cross-sectional view of the same MEMS microphone die 42. These two figures are discussed simply to detail some exemplary components that may make up a microphone die 42 used in accordance with various embodiments. As shown in FIGS. 5A and 5B, the microphone die 42 has a chip base/substrate 64, one portion of which supports a backplate 66. The microphone die 42 also includes a flexible diaphragm 68 that is suspended by springs 70 over, and movable relative to, the backplate 66. The backplate 66 and diaphragm 68 together form a variable capacitor. In illustrative embodiments, the backplate 66 is formed from single crystal silicon (e.g., a part of a silicon-on-insulator wafer), while the diaphragm 68 is formed from deposited polysilicon. In other embodiments, however, the backplate 66 and diaphragm 68 may be formed from different materials.

In the embodiment shown in FIGS. 5A and 5B, the substrate 64 includes the backplate 66 and other structures, such as a bottom wafer and a buried oxide layer 72 of a silicon-on-insulator (i.e., a SOI) wafer. A portion of the substrate 64 also forms a backside cavity 74 extending from the bottom of the substrate 64 to the bottom of the backplate 66. To facilitate operation, the backplate 66 has a plurality of through-holes 76 that lead to the backside cavity 74.

In operation, as generally noted above, audio/acoustic signals strike the diaphragm 68, causing it to vibrate, thus varying the distance between the diaphragm 68 and the backplate 66 to produce a changing capacitance. Such audio signals may contact the microphone die 42 from any direction. For example, the audio signals may travel upward, first through the backplate 66, and then partially through and against the diaphragm 68. In other embodiments, the audio signals may travel in the opposite direction.

As noted above, the primary circuit die 44 and/or the IPD 46 convert this changing capacitance into electrical signals that can be further processed. It should be noted that discussion of the specific microphone die 42 is for illustrative purposes only. Other microphone configurations thus may be used with illustrative embodiments of the invention. For example, rather than using an SOI wafer, the microphone die 42 may be formed from a bulk silicon wafer substrate.

One complexity associated with various embodiments involves electrically connecting the IPD 46 with the primary circuit die 44. For example, each chip can have a relatively low number of electrical interfaces, such as 5-10, or a higher number, such as 10-25, 25-50, or 50-60 (or more). Positioning this many interfaces on small dies, such as dies having faces of between 0.5 mm in length and 0.5 mm in width, can be particularly challenging.

Figure 6A:
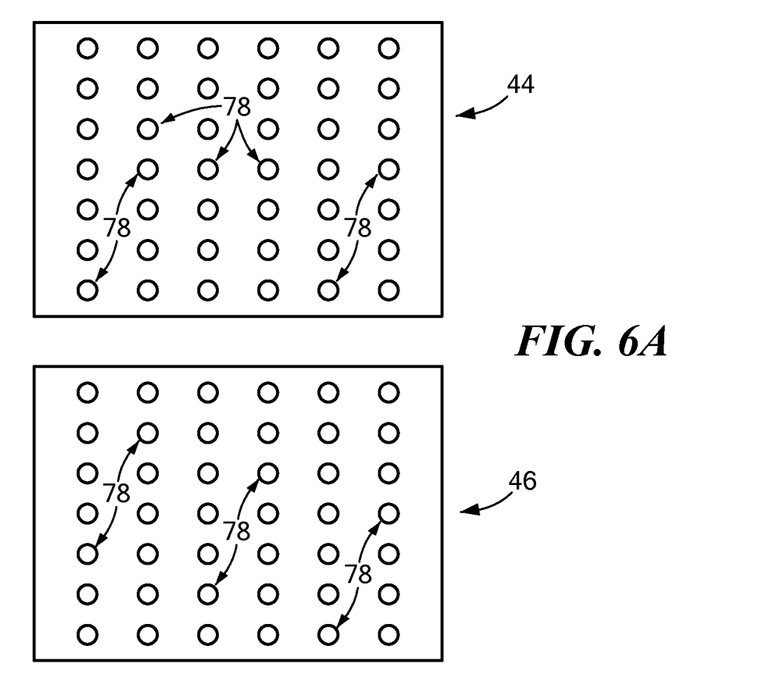
FIG. 6A schematically shows plan views of a primary circuit die and an integrated passive device die, highlighting the interconnect pattern/land pattern of both dies.

To those ends, FIG. 6A schematically shows a plan view of both chips; namely, if implemented using the stacked configuration of FIG. 4, this figure shows the top facing surface of the primary circuit die 44 and the bottom facing surface of the IPD 46. Each die has a corresponding array of lands, interfaces, bumps, and/or pads (each referred to using reference number 78) to electrically communicate with each other. In this example, each die forms a 6×7 array of fine pitch interfaces 78. Each of these interfaces is fabricated to have a small maximum dimension. For example, each of the interfaces 78 can be formed as a gold or copper bump with a diameter at the micron size, such as between 20 and 40 microns.

Figure 6B:
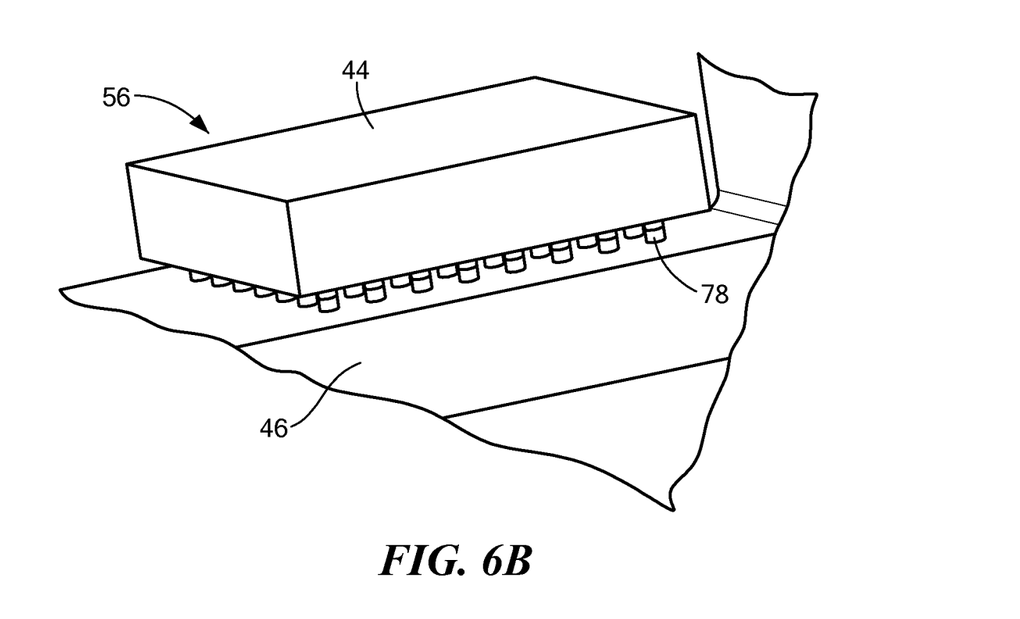
FIG. 6B schematically shows a perspective view of the primary circuit die and integrated passive device die in a stacked configuration.

FIG. 6B schematically shows a side perspective view of the stack 56 with the bumps 78 on the IPD 46 physically and electrically connected with the corresponding bumps 78 on the primary circuit die 44. As shown, the adjacent dies 44 and 46 are spaced from one another and yet, physically connected by their bumps 78. This may be considered to be a flip-chip connection. Similar embodiments may use a surface mount interconnection between the two dies 44 and 46.

Various embodiments thus receive the benefit of passive circuit elements without having excessive space constraints. This improvement therefore enables a much smaller packaged microphone system for use with miniature devices, such as hearing instruments. Accordingly, without requiring significantly difficult engineering tradeoffs, this improvement opens up an entirely new functionality that was formerly unavailable in many miniature devices.

Various embodiments apply to a number of different types of transducer systems within packages having air-filled cavities. For example, some embodiments can apply to a speaker system. Specifically, rather than have a MEMS microphone die 42 within the interior chamber 50, the system shown in FIG. 4 could have a MEMS speaker die.

Figure 7A:
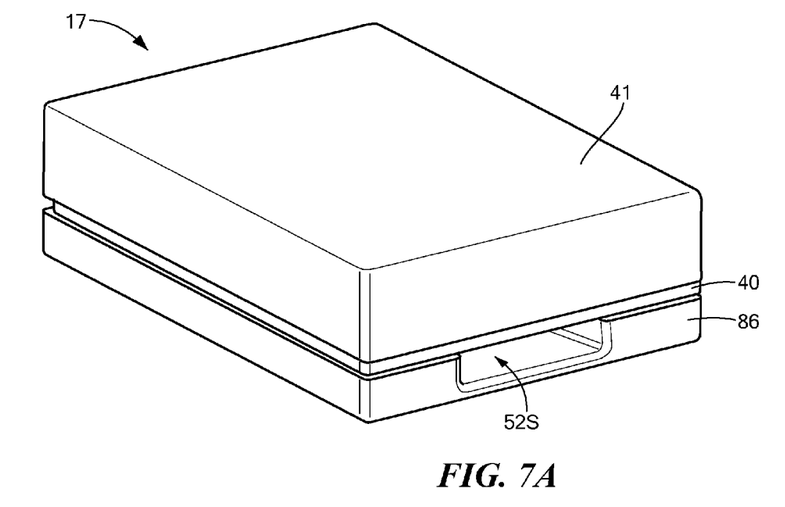
FIG. 7A schematically shows an alternative embodiment of the microphone system having multiple lids and a side port.
Figure 7B:
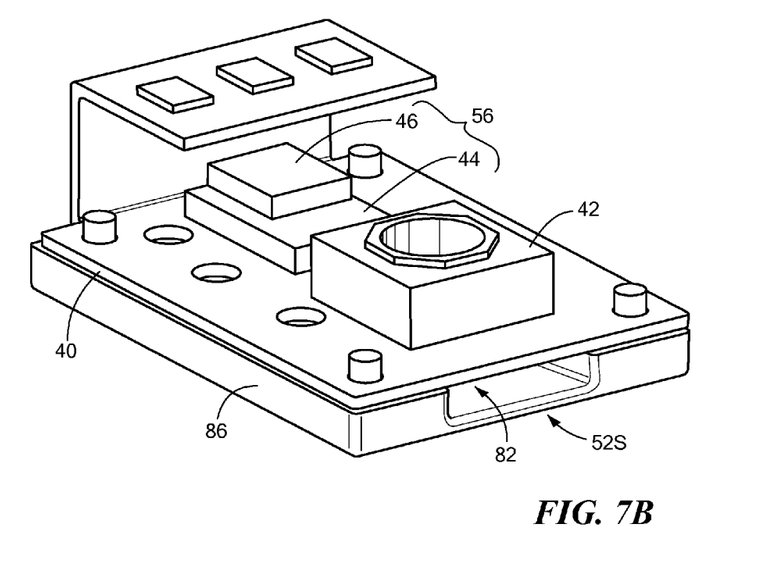
FIG. 7B schematically shows the microphone system of FIG. 7B with its lid removed.

As also noted above, the microphone system 17 itself may be implemented in a variety of different ways. To that end, FIGS. 7A and 7B schematically show a side port microphone system 17 implementing illustrative embodiments of the invention. FIG. 7A shows the microphone system 17 with the lid 41 on, while FIG. 7B schematically shows the microphone system 17 with the lid 41 removed. The lid 41 is removed simply to show details of the internal components.

Unlike the embodiment shown in FIGS. 3 and 4, this embodiment has two lids 41 and 86 that substantially enclose the base 40. Specifically, this embodiment has a top lid 41 (identified by the same reference number as the prior figures) secured to a bottom lid 86, sandwiching the base 40. Both lids 41 and 86 form the noted chamber 50, and a channel 82 that directs acoustic signals to the microphone die 42. The channel 82 begins at a side aperture 52S that leads to a base aperture 52 through the base 40. The microphone die 42 preferably is mounted over that base aperture 52. The chamber 50 contains the dies 42, 44, and 46 secured in a manner similar to that discussed above with regard to FIGS. 3 and 4. This embodiment also has an additional, out of plane base portion that can support additional dies.

One benefit of this embodiment is that it provides a relatively large back volume in a side port design. Moreover, the lids 41 and 86 can be formed from any of a number of different materials as described above. For example, to provide EMI protection/mitigation, the top lid 41 may be formed from a conductive material, such as metal, while the bottom lid 86 may be formed from an injection molded material.

Figure 8:
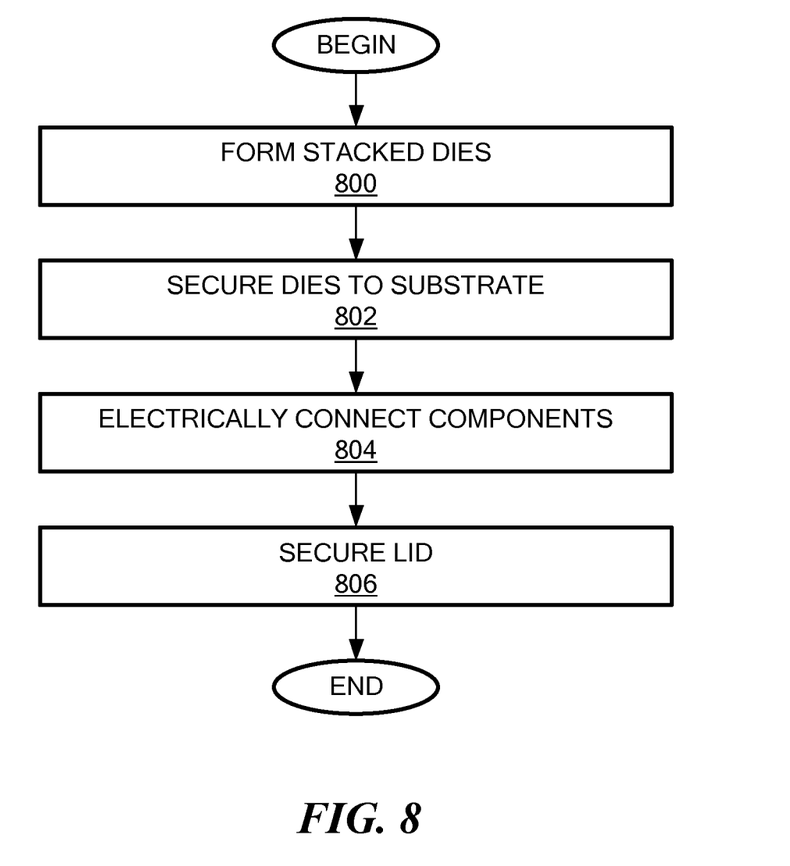
FIG. 8 shows a process of forming a microphone system in accordance with illustrative embodiments of the invention.

FIG. 8 shows a process of forming the microphone system 17 in accordance with various embodiments the invention.

Although this process is discussed in terms of the microphone system 17 of FIG. 3, it can be applied to other embodiments, such as that shown in FIGS. 7A and 7B. It should be noted that this process is a simplified version of an actual fabrication process they can have many more steps. For example, this process may have a testing step, a dicing step, or other step that is not discussed. In addition, many of the steps of the process can be performed in a different order than that disclosed. For example, steps 800 and 802 can be performed in a different order. In fact, some steps can be performed at substantially the same time. Accordingly, this process is but one of many different illustrative processes that may implement various embodiments the invention.

It also is contemplated that illustrative embodiments of the process will be performed using batch fabrication processes. Accordingly, discussion of fabricating a single microphone system 17 is for simplicity purposes only.

The process begins at step 800, which forms the stacked dies. To that end, after forming solder balls or solder bumps 78 on the land patterns of both dies 44 and 46, the process brings both dies 44 and 46 in contact, under heat and pressure, until they form the stack 56 as shown in FIG. 6B. Next, the process secures the stack 56 and the microphone die 42 to the base 40 using conventional adhesives or other means discussed above (step 802).

Step 804 then electrically connects the components. Specifically, in the embodiments discussed with regard to FIG. 4, this step physically connects wire bonds 58 from the microphone die 42 to the primary circuit die 44, and other wire bonds 58 from the primary circuit die 44 to the internal pads 60. The process concludes at step 806, which secures the lid 41 to the base 40.

Although the above discussion discloses various exemplary embodiments of the invention, it should be apparent that those skilled in the art can make various modifications that will achieve some of the advantages of the invention without departing from the true scope of the invention.

What is claimed is:

1. A microphone system comprising:
    a package including a base and a lid collectively forming an interior chamber;
    a MEMS microphone die secured within the interior chamber, the lid forming an aperture to allow acoustic access to the interior chamber and the MEMS microphone die,
   wherein the package comprises a substrate supporting the MEMS microphone die, and the lid is configured to mitigate electromagnetic interference;
    a primary circuit die located within the interior chamber and electrically connected to the MEMS microphone die and comprising at least one active circuit element;
    a secondary lid configured to secure the lid, sandwiching the base,
   wherein the lid and the secondary lid form the interior chamber,
   further wherein the MEMS microphone die is configured to receive acoustic signals through the aperture and from a channel that directs the acoustic signals to the MEMS microphone die,
   wherein the channel begins at a side aperture located between a side of the lid and a side of the second lid, the side aperture leading to the base aperture through the base; and
    an integrated device die, with only passive circuit elements, electrically connected to the primary circuit die,
   wherein the integrated device die is configured to perform at least one of radio frequency (RF) filtering and power supply decoupling.

2. The microphone system as defined by claim 1 wherein the integrated device die is physically mounted to the primary circuit die.

3. The microphone system as defined by claim 2 wherein the integrated device die is surface mounted to the primary circuit die.

4. The microphone system as defined by claim 2 wherein one or both the primary circuit die and integrated device die comprises a plurality of bumps.

5. The microphone system as defined by claim 2 wherein each of the primary circuit die and integrated device die comprises between 20 and 60 bumps.

6. The microphone system as defined by claim 2 wherein the integrated device die and primary circuit die are arranged in a stacked configuration.

7. The microphone system as defined by claim 1 wherein the substrate comprises circuit board material.

8. The microphone system as defined by claim 7 wherein the microphone die is mounted over the aperture.

9. The microphone system as defined by claim 1, wherein the interior chamber includes the base onto which the MEMS microphone die and primary circuit die are formed.

10. The microphone system as defined by claim 9, wherein the lid has an aperture through which audio signals enter the interior chamber, the lid being connected to the base.

11. The microphone system as defined in claim 10, wherein the lid is connected to the base by conductive adhesive, non-conductive adhesive, solder, or bond pad.

12. The microphone system as defined by claim 1, wherein the MEMS microphone die and primary circuit die are electrically connected using wire bond.

13. The microphone system as defined by claim 1, wherein the aperture is off center relative to the MEMS microphone die.

14. The microphone system as defined by claim 1, wherein the microphone die is mounted over the aperture.

15. The microphone system as defined by claim 1, wherein the integrated device die further includes at least one passive element.

16. The microphone system as defined by claim 1, wherein the integrated device die is positioned in the interior chamber.

17. The microphone system as defined by claim 1, wherein the lid is conductive.

18. The microphone system as defined by claim 1, wherein the MEMS microphone die, the primary circuit die and the integrated device die are a part of the package.

19. A transducer system comprising:
a package including a base and a lid collectively forming an interior chamber, the interior chamber having at least one wall;
a MEMS acoustic transducer secured to the at least one wall within the interior chamber, the package forming an aperture, the aperture configured to permit acoustic access to the interior of the chamber and the MEMS acoustic transducer;
a secondary lid configured to secure the lid, sandwiching the base,
wherein the lid and the secondary lid form the interior chamber and a channel that directs acoustic signals to the MEMS acoustic transducer, the MEMS acoustic transducer being configured to receive the acoustic signals through the aperture,
further wherein the channel begins at a side aperture located between a side of the lid and a side of the second lid, the side aperture leading to the aperture through the base;
a primary circuit die located within the interior chamber and electrically connected to the MEMS acoustic transducer and including at least one active circuit element; and
a plurality of pads formed on the package, the MEMS acoustic transducer being electrically connected to at least one of the plurality of pads; and
an integrated device die, with only passive circuit elements, electrically connected with the primary circuit die,
wherein the integrated device die is configured to perform at least one of radio frequency (RF) filtering and power supply decoupling.

20. The microphone system as defined by claim 19 wherein the integrated device die is physically mounted to the primary circuit die to form a stack that is secured to the at least one wall of the chamber.

21. The microphone system as defined by claim 20 wherein the integrated device die and primary circuit die are arranged in a stacked configuration.

22. The microphone system as defined by claim 19 wherein one or both the primary circuit die and integrated device die comprises a plurality of bumps.

23. The microphone system as defined by claim 19 wherein the MEMS acoustic transducer comprises a MEMS microphone die.

24. The microphone system as defined by claim 19 wherein the MEMS acoustic transducer comprises means for converting an acoustic signal into an electrical signal and means for directing the electrical signal toward the primary circuit die for processing.

25. The microphone system as defined by claim 19 wherein the integrated device die is flip chip mounted to the primary circuit die.

26. The microphone system as defined by claim 19, wherein the package comprises a substrate supporting the MEMS microphone die, and the lid is configured to mitigate electromagnetic interference.

27. The microphone system as defined by claim 19, wherein the microphone die is mounted over that base aperture.

28. The microphone system as defined by claim 19, wherein the integrated device die further includes at least one passive element.

29. The microphone system as defined by claim 19, wherein the integrated device die is positioned in the interior chamber.

30. The microphone system as defined by claim 19, wherein the lid is conductive.

31. The microphone system as defined by claim 19, wherein the MEMS microphone die, the primary circuit die and the integrated device die are a part of the package.

* * * * *